United States Patent [19]

Yu

[11] Patent Number: 5,962,876

[45] Date of Patent: Oct. 5, 1999

[54] LOW VOLTAGE TRIGGERING ELECTROSTATIC DISCHARGE PROTECTION CIRCUIT

[75] Inventor: Ta-Lee Yu, Hsinchu Hsien, Taiwan

[73] Assignee: Winbond Electronics Corporation, Hsinchu, Taiwan

[21] Appl. No.: 09/055,619

[22] Filed: Apr. 6, 1998

[51] Int. Cl.[6] .......................... H01L 29/74; H01L 31/111
[52] U.S. Cl. .......................... 257/133; 257/146; 257/173; 257/174
[58] Field of Search ..................... 257/133, 146, 257/173, 174

[56] References Cited

U.S. PATENT DOCUMENTS 5,465,189  11/1995  Polgreen ................................ 361/58
5,576,557  11/1996  Ker et al. .............................. 257/173

OTHER PUBLICATIONS

McGraw–Hill Dictionary of Scientific and Technical Terms, 5th Ed, 5 Ed, p. 774.

Primary Examiner—Ngân V. Ngô
Attorney, Agent, or Firm—Fish & Richardson P.C.

[57] ABSTRACT

An electrostatic discharge protection circuit comprises a semiconductor layer of a first conductivity type, a floating semiconductor layer of a second conductivity type, a first doped region of the first conductivity type, a first doped region of the second conductivity type, a second doped region of the second conductivity type, a gate structure, and a second doped region of the first conductivity type. The floating semiconductor layer of a second conductivity type is in contact with the semiconductor layer of a first conductivity type to establish a junction therebetween. The first doped region of the first conductivity type is formed in the semiconductor layer of a second conductivity type and connected to a first node. The first doped region of the second conductivity type is formed in the semiconductor layer of a first conductivity type and connected to a second node. The second doped region of the second conductivity type spans the junction. The gate structure overlies a portion of the semiconductor layer of a first conductivity type between those doped regions of the second conductivity type. The second doped region of the first conductivity type is formed in the semiconductor layer of a first conductivity type and connected to the second node. The second doped region of the second conductivity type will break down to trigger the conduction of a discharge current flowing through the junction when electrostatic discharge stress occurs between the first node and the second node.

20 Claims, 4 Drawing Sheets

LOW VOLTAGE TRIGGERING ELECTROSTATIC DISCHARGE PROTECTION CIRCUIT

BACKGROUND OF THE INVENTION

1. Field of the Invention

The present invention generally relates to electrostatic discharge protection techniques for semiconductor integrated circuitry, and, more specifically, relates to an electrostatic discharge protection circuit triggered at a low voltage.

2. Description of the Prior Art

Electrostatic discharge, ESD hereinafter, is a common phenomenon that occurs during handling of semiconductor integrated circuit ("IC") devices. Electrostatic charges may accumulate and cause potentially destructive effects on an IC device. ESD stressing typically can occur during a testing phase of IC fabrication, during installation of the IC onto a circuit board, as well as during use of equipment into which the IC has been installed. Damage to a single IC due to poor ESD protection in an electronic device can partially or sometimes completely hamper its operation.

Sub-micron CMOS ICs have become increasingly vulnerable to ESD damage due to advanced processes, such as the use of a lightly-doped drain ("LDD") structure and clad silicide diffusions. Therefore, lateral silicon-controlled rectifiers (LSCRs) have been proposed, for example, in U.S. Pat. No. 5,012,317, as ESD protection circuits for facilitating ESD protection. The cross-sectional view of a conventional lateral silicon-controlled rectifier fabricated onto a semiconductor substrate is illustrated in FIG. 1.

As shown in FIG. 1, the silicon-controlled rectifier is fabricated on a P-type silicon substrate 10 in which an N-well region 11 is formed. A pair of a P-type doped region 12 and an N-type doped region 13 are formed within the extent of the N-well region 11 and spaced apart from each other, while another pair of an N-type doped region 14 and a P-type doped region 15 are formed within the extent of the P-type silicon substrate 10 and spaced apart from each other. The P-type doped region 12 and the N-type doped region 13 are connected together to an IC pad 1. The IC pad 1 is electrically connected to an internal circuit 2, which is vulnerable to ESD damage and should be protected by the lateral silicon-controlled rectifier. In addition, the N-type doped region 14 and the P-type doped region 15 are connected together to a potential node $V_{SS}$, which is generally connected to ground under normal operation.

Accordingly, the P-type doped region 12, the N-well region 11, and the P-type silicon substrate 10 serve as the emitter, base, collector, respectively, of a PNP bipolar junction transistor 20, while the N-well region 11, the P-type silicon substrate 10, and the N-type doped region 14 serve as the collector, base, emitter, respectively, of an NPN bipolar junction transistor 21. Referring to FIG. 2, the equivalent circuit diagram of the conventional lateral silicon-controlled rectifier shown in FIG. 1 is schematically depicted. Furthermore, as shown in FIG. 2, resistors 22 and 23 stand for the respective spreading resistance of the N-well region 11 and the P-type silicon substrate 10.

When ESD occurs at the IC pad 1, the P/N junction between the N-well region 11 and the P-type silicon substrate 10 breaks down and then forward biases the P/N junction between the P-type silicon substrate 10 and the N-type doped region 14. Therefore, the lateral silicon-controlled rectifier composed of the PNP transistor 20 and NPN transistor 21 is triggered to conduct the resulting ESD current and thus bypass the ESD stress so as to protect the internal circuit 2 from ESD damage.

As mentioned above, triggering of the conventional lateral silicon-controlled rectifier to turn on and thus bypass the ESD stress heavily relies on the junction breakdown between the N-well region 11 and the P-type silicon substrate 10. However, both N-well region 11 and the P-type silicon substrate 10 have doping concentrations so low that the trigger voltage of the lateral silicon-controlled rectifier is roughly 30V or more. For example, with CMOS fabrication technology of 0.6~0.8 µm, gate oxides of about 150~200 Å in thickness, utilized in the internal circuit 2, may be damaged at voltages lower than the trigger voltage of the conventional lateral silicon-controlled rectifier.

To lower the trigger voltage, U.S. Pat. No. 5,465,189 has proposed "A LOW VOLTAGE TRIGGERING SEMICONDUCTOR CONTROLLED RECTIFIER" as illustrated in FIG. 3. In addition to those elements disclosed in FIG. 1, another N-type doped region 16 and a gate structure 17 are involved in this conventional ESD protection circuit. The N-type doped region 16 is provided with one portion formed in N-type well region 11 and another portion formed in the P-type silicon substrate 10. In other words, the N-type doped region 16 stretches across the junction of the N-well region 11 and the P-type silicon substrate 10. The gate structure 17, which is provided with a gate dielectric layer 18 and a gate electrode 19 connected to the $V_{SS}$ node, is formed to cover a portion of silicon substrate 10 between the N-type doped regions 14 and 16.

FIG. 4 is the equivalent circuit of FIG. 3. In FIG. 4, reference numeral 24 stands for an metal-oxide-semiconductor field-effect transistor (MOSFET) constituted by the N-type doped regions 14 and 16, the portion of the silicon substrate 10 between the N-type doped regions 14 and 16, and the gate structure 17. When ESD occurs at the IC pad 1, the MOS transistor 24 enters breaks down, thereby triggering the lateral silicon-controlled rectifier to conduct a discharge current. Accordingly, the trigger voltage of the ESD protection circuit as shown in FIG. 3 can be lowered to the breakdown voltage of the MOS transistor 24.

However, the MOS transistor 24 can not be integral with an output buffer when the IC pad 1 denotes an output pad. Moreover, as integrated circuit processing advances to smaller dimensions the resistance of the substrate decreases, making it harder to ESD trigger the lateral silicon-controlled rectifier.

For the foregoing reason, there is a need for an ESD protection circuit, which can be triggered at a decreased voltage, particularly adaptable for CMOS circuits with low resistance substrates.

SUMMARY OF THE INVENTION

Therefore, an object of the present invention is to provide an ESD protection circuit having a trigger voltage lower than the voltages at which an internal circuit may be damaged.

Another object of the present invention is to provide an ESD protection circuit consuming less layout area.

The present invention achieves the above-indicated objects by providing an electrostatic discharge protection circuit triggered at a low voltage. According to the present invention, the electrostatic discharge protection circuit comprise a semiconductor layer of a first conductivity type, a floating semiconductor layer of a second conductivity type, a first doped region of the first conductivity type, a first doped region of the second conductivity type, a second doped region of the second conductivity type, a gate structure, and a second doped region of the first conductivity type. The floating semiconductor layer of a second conductivity type is in contact with the semiconductor layer of a first conductivity type to establish a junction therebetween. The first doped region of the first conductivity type is formed in the semiconductor layer of a second conductivity type and connected to a first node. The first doped region of the second conductivity type is formed in the semiconductor layer of a first conductivity type and connected to a second node. The second doped region of the second conductivity type spans the junction. The gate structure overlies a portion of the semiconductor layer of a first conductivity type between those doped regions of the second conductivity type. The second doped region of the first conductivity type is formed in the semiconductor layer of a first conductivity type and connected to the second node. The second doped region of the second conductivity type will break down to trigger the conduction of a discharge current flowing through the junction when electrostatic discharge stress occurs between the first node and the second node.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

According to the present invention, an ESD protection circuit comprises an MOS transistor, an open-base PNP bipolar junction transistor and an NPN bipolar transistor so as to reduce the voltage at which the junction constituted by an N-well region and a P-type substrate breaks down. Accordingly, the ESD protection circuit of the present invention has a trigger voltage lower than the voltages at which an internal circuit may be damaged.

Figure 5:
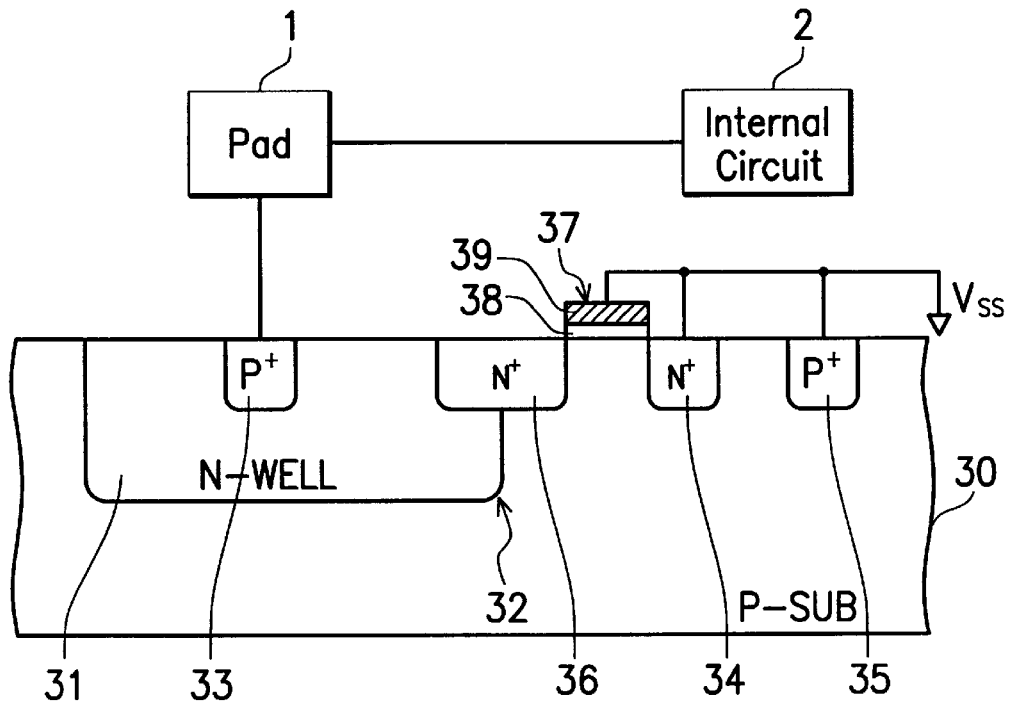
FIG. 5 depicts a cross-sectional view of one preferred embodiment of the present invention fabricated onto a semiconductor substrate.

Referring to FIG. 5, an ESD protection circuit according to one preferred embodiment of the present invention fabricated onto a semiconductor substrate is illustrated in a cross-sectional view. In this embodiment, the ESD protection circuit is generally fabricated onto a P-type semiconductor layer 30 in which an N-type semiconductor layer 31 is formed to establish a P/N junction 32 therebetween. Preferably, the P-type semiconductor 30 can be a P-type silicon substrate, and the N-type semiconductor 31 can be a well region formed in the P-type substrate by diffusion processing, accordingly. Note that a first N-type doped region 34 and a second P-type doped region 35 are formed within the extent of the P-type semiconductor layer 30 and spaced apart from each other, but only a first P-type doped region 33 formed in the N-type semiconductor layer 31. The first P-type doped region 33 is electrically connected to the IC pad 1. The IC pad 1 is electrically coupled to the internal circuit 2, which is vulnerable to ESD damage and should be protected by the ESD protection circuit of the present invention. Moreover, the first N-type doped region 34 and the second P-type doped region 35 are connected together to a potential node $V_{SS}$, which is generally coupled to grounding potential under normal operation.

In addition, an N-type doped region 36 is configured with one portion formed in N-type semiconductor layer 31 and another portion formed in the P-type semiconductor layer 30. In other words, the N-type doped region 36 spans the N-type semiconductor 31 and the P-type semiconductor substrate 30. A gate structure 37, comprising a gate dielectric layer 38 and a gate electrode 39 connected to the $V_{SS}$ node from the bottom to the top, covers the portion of the P-type semiconductor layer 30 between the N-type doped regions 34 and 36. Preferably, the gate dielectric layer 38 is made of thermally-grown silicon oxides, and the electrode 39 is made of polysilicon by means of low-pressure chemical vapor deposition processing.

Figure 6:
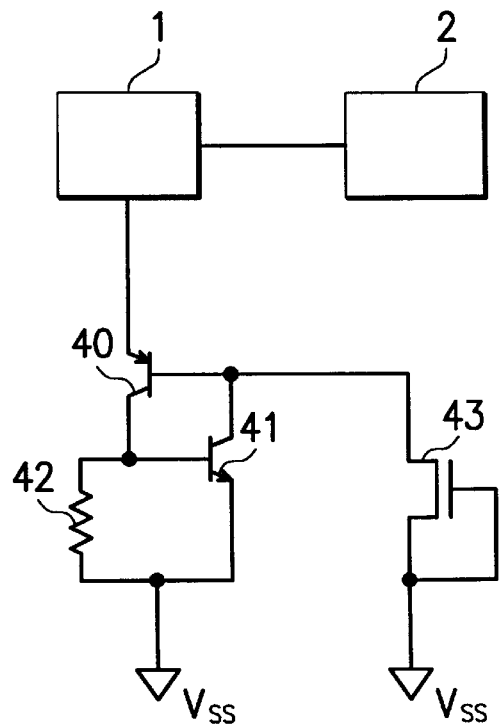
FIG. 6 schematically depicts an equivalent circuit diagram of FIG. 5.

Accordingly, the first P-type doped region 33, the N-type semiconductor layer 31, and the P-type semiconductor layer 30 serve as the emitter, base, and collector, respectively, of a PNP bipolar junction transistor 40. The N-type semiconductor layer 31, the P-type semiconductor layer 30, and the first N-type doped region 34 serve as the collector, base, and emitter, respectively, of an NPN bipolar junction transistor 41. Therefore, the PNP transistor 41 and the NPN transistor 41 constitute a silicon-controlled rectifier. A metal-oxide-semiconductor field-effect transistor (MOSFET) 43 is constituted by the N-type doped regions 34 and 36, the portion of the semiconductor layer 30 between the N-type doped regions 34 and 36, and the gate structure 37. FIG. 6 schematically depicts the equivalent circuit diagram of the ESD protection circuit of FIG. 5. In FIG. 6, a resistor 42 stands for the spreading resistance of the P-type semiconductor layer 30.

When ESD stress occurs at the IC pad 1, the P/N junction between the second N-type doped region 36 and the P-type semiconductor 30 enters avalanche breakdown. In other words, the MOS transistor 43 breaks down to trigger the silicon-controlled rectifier to conduct the resulting ESD current and bypass the ESD stress, thereby protecting the internal circuit 2 from ESD damage. Accordingly, the trigger voltage of the ESD protection circuit according to the present invention is the breakdown voltage, 8~12V, of the MOS transistor 43.

Figure 1:
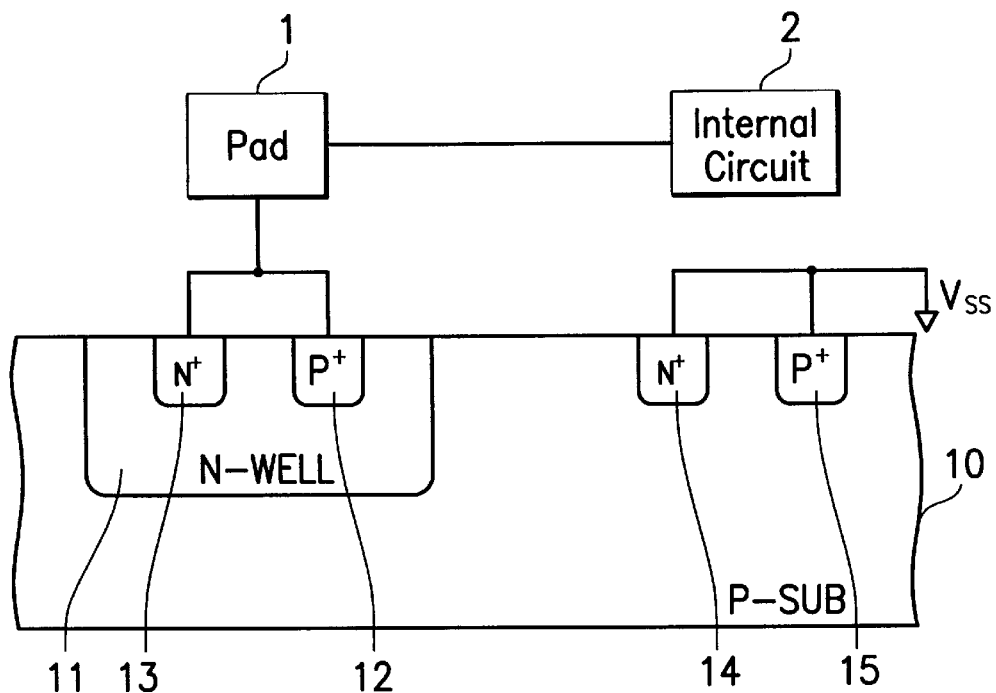
FIG. 1 depicts a cross-sectional view of a conventional lateral silicon-controlled rectifier fabricated onto a semiconductor substrate.
Figure 2:
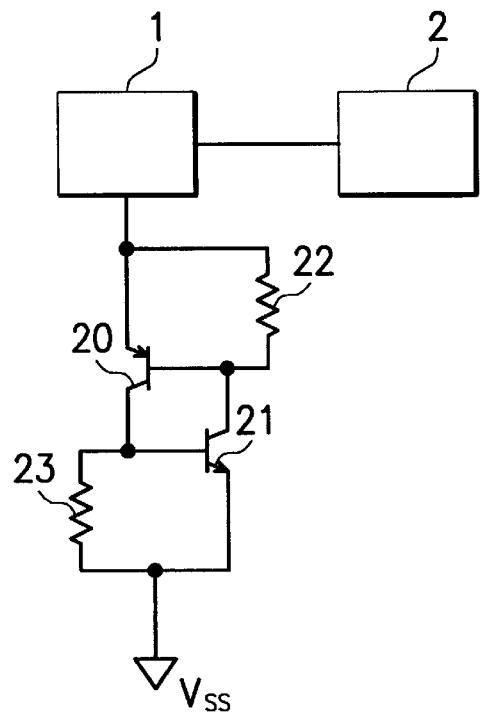
FIG. 2 schematically depicts an equivalent circuit diagram of the conventional lateral silicon-controlled rectifier as shown in FIG. 1.
Figure 3:
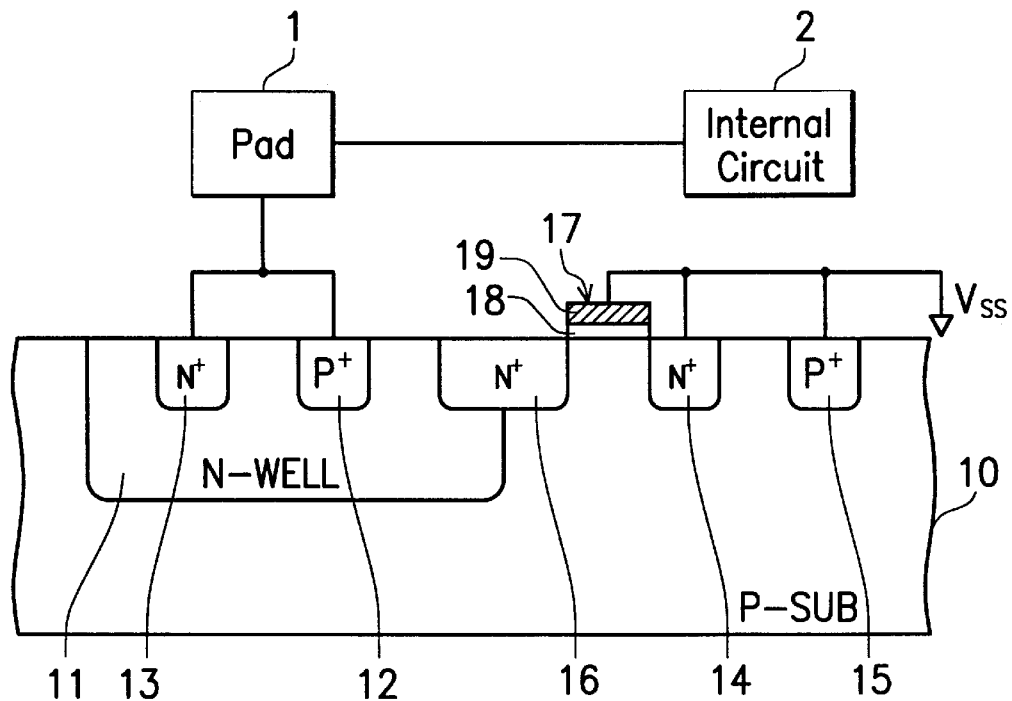
FIG. 3 depicts a cross-sectional view of a conventional ESD protection circuit fabricated onto a semiconductor substrate.
Figure 4:
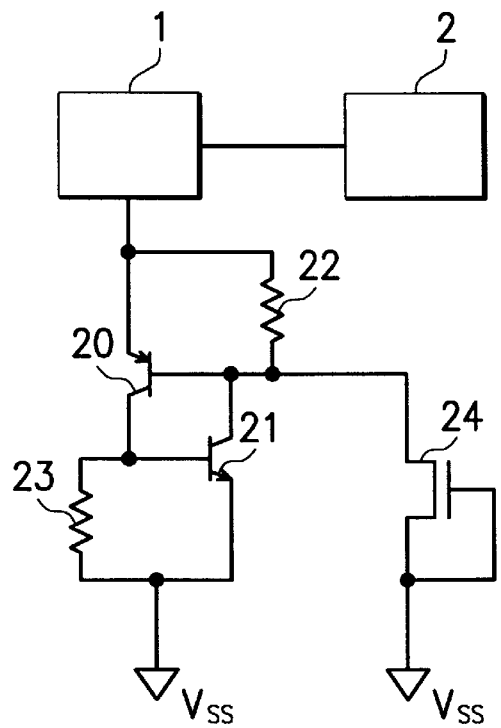
FIG. 4 schematically depicts an equivalent circuit diagram of the conventional ESD protection circuit as shown in FIG. 1.

Moreover, since only the first P-type doped region 33 is formed in the N-type semiconductor layer 31 and no contact region provided therein (as compared to the N-type region 13 shown in FIG. 1), the N-type semiconductor layer 31 is thus floating. In other words, the PNP bipolar junction transistor 40 is configured with open-base as shown in FIG. 6. Consequently, the floating N-type semiconductor layer 31 can decrease the breakdown voltage, based on the expression disclosed in the B. J. Baliga, "POWER SEMICONDUCTOR DEVICES," Chapter 5, Page 236, as follows:

$$BV_{CEO} = BV_{CBO}/\sqrt[n]{\beta}$$

In addition, the silicon-controlled rectifier enters snapback at a low holding voltage of about 1~3V.

Accordingly, the ESD protection circuit of the present invention is triggered to bypass the ESD stress at the breakdown voltage of the MOS transistor 43, and then clamp the potential difference of two circuit node (e.g., the IC pad 1 and the $V_{SS}$ node) to the holding voltage at which the silicon-controlled rectifier enters snapback.

Figure 7:
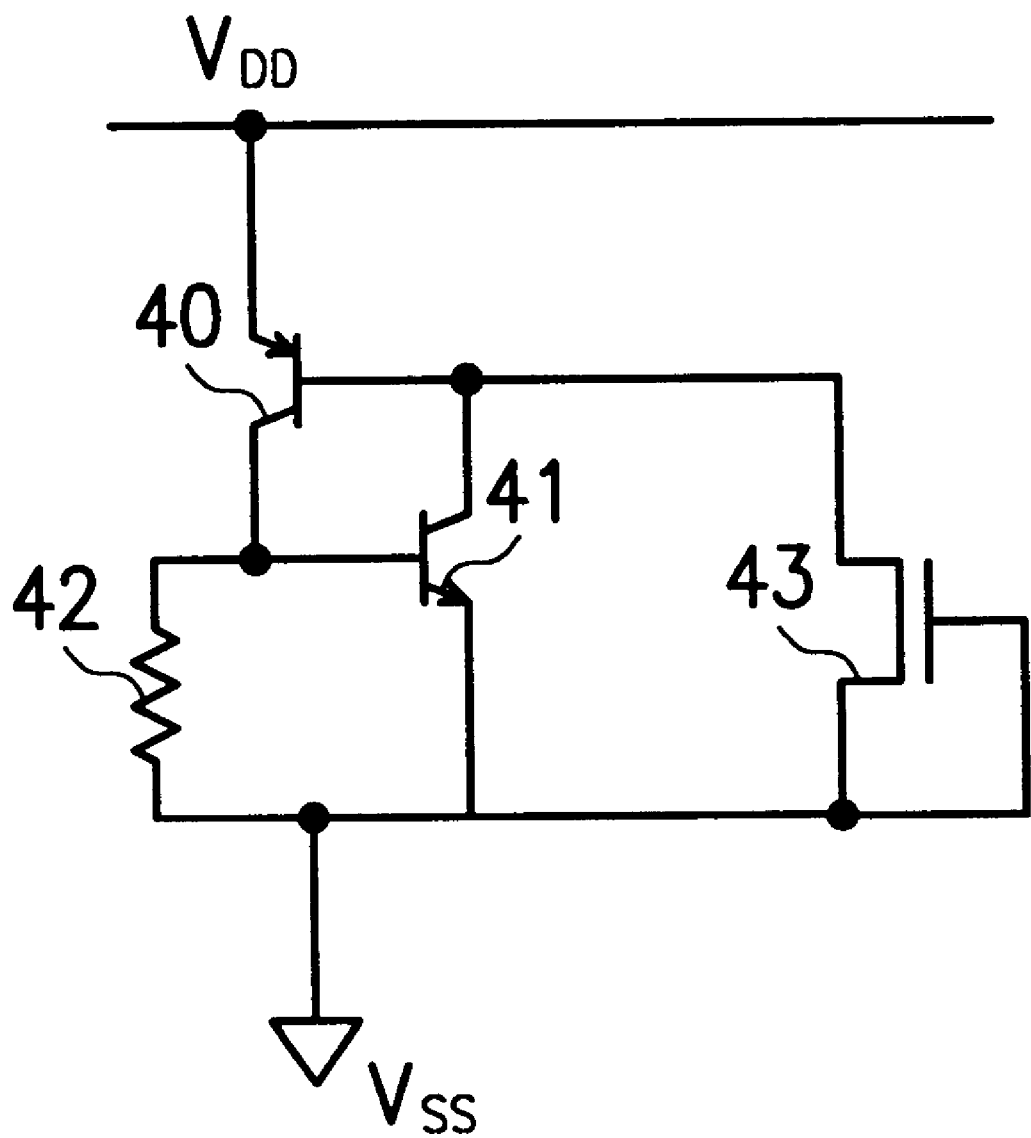
FIG. 7 schematically depicts an equivalent circuit diagram of another preferred embodiment of the present invention.

Referring to FIG. 7, the equivalent circuit diagram of another preferred embodiment of the present invention configured with the first P-type doped region 33 electrically connected to $V_{DD}$ node instead of being connected to the IC pad 1, is schematically depicted. Under normal operation 5V or 3.3V is applied to the $V_{DD}$ node.

In conclusion, the MOS transistor is used to trigger the silicon-controlled rectifier comprising the open-base PNP bipolar junction transistor and the NPN bipolar transistor at a low voltage to enter snapback according to the present invention. Therefore, the ESD protection circuit of the present invention has a trigger voltage less than the voltages at which the internal circuit 2 may be damaged, and two circuit nodes at which ESD stress occurs can be clamped to a decreased holding voltage. In addition, the fact that no contact region is formed in the N-type semiconductor layer reduces the necessary layout area for the ESD protection circuit.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention to practice various other embodiments and make various modifications suited to the particular use contemplated. It is intended that the scope of the invention be defined by the following claims and their equivalents.

What is claimed is:

1. An electrostatic discharge protection circuit, comprising:
    a semiconductor layer of a first conductivity type;
    a floating semiconductor layer of a second conductivity type in contact with said semiconductor layer of a first conductivity type to establish a junction therebetween;
    a first doped region of the first conductivity type formed in said semiconductor layer of a second conductivity type and connected to a first node;
    a first doped region of the second conductivity type formed in said semiconductor layer of a first conductivity type and connected to a second node;
    a second doped region of the second conductivity type spanning said junction;
    a gate structure overlying a portion of said semiconductor layer of a first conductivity type between said doped regions of the second conductivity type; and
    a second doped region of the first conductivity type formed in said semiconductor layer of a first conductivity type and connected to said second node;
    wherein said second doped region of the second conductivity type enters breakdown to trigger the conduction of a discharge current flowing through said junction when electrostatic discharge stress occurs between said first node and said second node.

2. The electrostatic discharge protection circuit as claimed in claim 1, wherein the first conductivity type is P-type and the second conductivity type is N-type.

3. The electrostatic discharge protection circuit as claimed in claim 2, wherein said first node is connected to an integrated circuit pad.

4. The electrostatic discharge protection circuit as claimed in claim 3, wherein said second node is powered by a relatively low potential under normal operation.

5. The electrostatic discharge protection circuit as claimed in claim 4, wherein said gate structure comprises a dielectric layer and an electrode.

6. The electrostatic discharge protection circuit as claimed in claim 5, wherein said electrode is powered by said relatively low potential under said normal operation.

7. The electrostatic discharge protection circuit as claimed in claim 2, wherein said first node is powered by a relatively high potential under normal operation.

8. The electrostatic discharge protection circuit as claimed in claim 7, wherein said second node is powered by a relatively low potential under said normal operation.

9. The electrostatic discharge protection circuit as claimed in claim 8, wherein said gate structure comprises a dielectric layer and an electrode.

10. The electrostatic discharge protection circuit as claimed in claim 9, wherein said electrode is powered by said relatively low potential under said normal operation.

11. An electrostatic discharge protection circuit, comprising:
    a P-type semiconductor layer;
    a floating N-type semiconductor layer in contact with said P-type semiconductor layer to establish a junction therebetween;
    a first P-type doped region formed in said N-type semiconductor layer and connected to a first node;
    a first N-type doped region formed in said P-type semiconductor layer and connected to a second node;
    a second N-type doped region spanning said junction;
    a gate structure overlying a portion of said P-type semiconductor layer between said N-type doped regions; and
    a second P-type doped region formed in said P-type semiconductor layer and connected to said second node.

12. The electrostatic discharge protection circuit as claimed in claim 11, wherein said first node is connected to an integrated circuit pad and said second node is powered by a relatively low potential under normal operation.

13. The electrostatic discharge protection circuit as claimed in claim 11, wherein said first node and said second node are powered by a relatively high potential and a relatively low potential, respectively, under normal operation.

14. The electrostatic discharge protection circuit as claimed in claim 11, wherein said gate structure comprises a dielectric layer and an electrode.

15. The electrostatic discharge protection circuit as claimed in claim 14, wherein said electrode is powered by a relatively low potential under normal operation.

16. An electrostatic discharge protection circuit, comprising:
    a silicon-controlled rectifier connected between a first node and a second node, said silicon-controlled rectifier having a floating well formed in a semiconductor substrate to establish a junction therebetween; and a MOS device connected in parallel to said silicon-controlled rectifier, said MOS transistor having one source/drain region spanning said junction;

said MOS device entering breakdown to trigger said silicon-controlled rectifier conducting a discharge current when an electrostatic discharge potential occurs between said first node and said second node.

17. The electrostatic discharge protection circuit as claimed in claim 16, wherein said first node is connected to an integrated circuit pad and said second node is powered by a relatively low voltage source under normal operation.

18. The electrostatic discharge protection circuit as claimed in claim 16, wherein said first node and said second node are powered by a relatively high voltage source and a relatively low voltage source, respectively, under normal operation.

19. The electrostatic discharge protection circuit as claimed in claim 16, wherein said gate structure comprises a dielectric layer and an electrode.

20. The electrostatic discharge protection circuit as claimed in claim 19, wherein said electrode is powered by a relatively low voltage source under normal operation.

* * * * *